US 7,718,516 B2

(12) United States Patent
Hao et al.

(10) Patent No.: US 7,718,516 B2
(45) Date of Patent: May 18, 2010

(54) METHOD FOR EPITAXIAL GROWTH OF (110)-ORIENTED SRTIO₃ THIN FILMS ON SILICON WITHOUT TEMPLATE

(75) Inventors: Jianhua Hao, Hong Kong (HK); Ju Gao, Hong Kong (HK)

(73) Assignee: The University of Hong Kong, Hong Kong (CN)

( * ) Notice: Subject to any disclaimer, the term of this patent is extended or adjusted under 35 U.S.C. 154(b) by 253 days.

(21) Appl. No.: 11/690,188

(22) Filed: Mar. 23, 2007

(65) Prior Publication Data

US 2008/0105955 A1    May 8, 2008

Related U.S. Application Data

(60) Provisional application No. 60/785,668, filed on Mar. 23, 2006.

(51) Int. Cl.
*H01L 21/20* (2006.01)
*H01L 21/36* (2006.01)

(52) U.S. Cl. .................. 438/481; 438/483; 438/715; 257/E21.09

(58) Field of Classification Search ............. 438/3, 438/481, 483, 715; 257/E21.09
See application file for complete search history.

(56) References Cited

U.S. PATENT DOCUMENTS

| 5,225,031 A | 7/1993 | McKee et al. |
| 5,270,298 A | 12/1993 | Ramesh |
| 5,830,270 A | 11/1998 | McKee et al. |
| 6,642,539 B2 | 11/2003 | Ramesh et al. |

OTHER PUBLICATIONS

S. Migita and S. Sakai; *Epitaxial Structure SrTiO₃ {011} on Si{001}*; Journal of Applied Physics 89 (2001) 5421-5424.
R.A. McKee, F.J. Walker and M.F. Chisholm; *Crystalline Oxides on Silicon The First Five Monolayers*; Physical Review Letters 81 (1998) 3014-3017.
J.H. Hao et al.; *Interface Structure and Phase of Epitaxial SrTiO₃ (110) Thin Films Grown Directly on Silicon*; Applied Physics Letters 87 (2005) 131908-1-131908-3.
J.H. Hao, J. Gao and H.K. Wong; *SrTiO₃ (110) Thin Films Grown Directly on Different Oriented Silicon Substrates*; Appl. Phys. A 81 (2005) 1233-1236.

*Primary Examiner*—Thien F Tran
(74) *Attorney, Agent, or Firm*—Robert D. Katz, Esq.; Cooper & Dunham LLP

(57) ABSTRACT

A process and structure utilizes pulsed laser deposition technique to grow SrTiO₃ (STO) films with single (110) out-of-plane orientation upon a surface of all (100), (110) and (111)-oriented silicon (Si) substrates. No designed buffer layer is needed beneath the STO thin films. The in-plane alignments for the epitaxial STO films grown directly on Si (100) are as STO [001]//Si [001] and STO [1$\bar{1}$0]/Si [010]. The SrTiO₃/Si interface is epitaxially crystallized without any amorphous oxide layer. The formation of a coincident site lattice at the interface between Si and a Sr-silicate and/or STO helps to stabilize STO in the epitaxial orientation. The invention can be applied to epitaxial template and barrier for the integration of many other functional oxide materials on silicon. In particular, the (110)-oriented STO structure is useful for practical applications such as the preparation of ferroelectric-insulator-semiconductor devices as well as providing a broad solution to the generic problem of polarity discontinuities at perovskite heterointerfaces.

8 Claims, 5 Drawing Sheets

Figure 1:
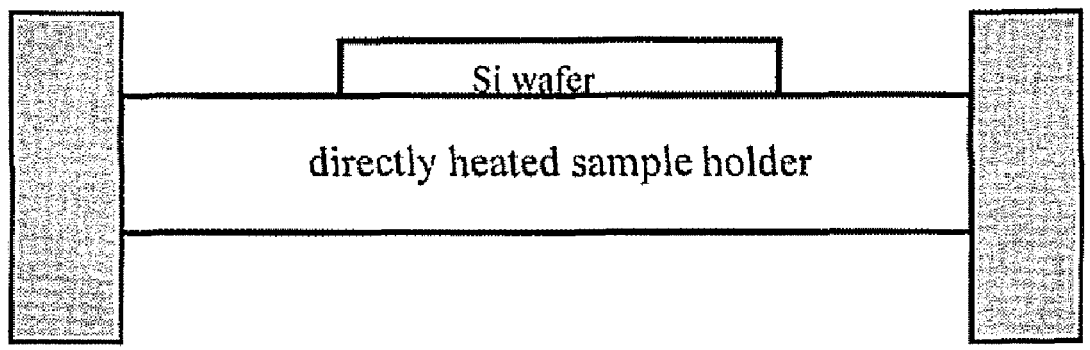

METHOD FOR EPITAXIAL GROWTH OF (110)-ORIENTED SRTIO₃ THIN FILMS ON SILICON WITHOUT TEMPLATE

CROSS-REFERENCE TO RELATED APPLICATION

This application claims the benefit of U.S. Provisional Patent Application Ser. No. 60/785,668, filed Mar. 23, 2006, the entire contents of which is incorporated by reference herein.

FIELD OF THE INVENTION

The invention relates generally to (110)-oriented $SrTiO_3$ thin films grown directly on silicon suitable for a variety of applications, for example, a perovskite oxide device and a high dielectric constant capacitor material.

BACKGROUND OF THE INVENTION

Crystalline oxide thin films on Si have attracted considerable attention in recent years since the unique properties of those oxide materials can be combined with Si-based integrated circuits. For instance, STO is now considered as a high dielectric constant oxide to replace $SiO_2$ as a gate oxide in metal-oxide-semiconductor devices. On the other hand, STO is a cubic perovskite structure and has a lattice constant of 0.3905 nm, which is closely matched to a large number of other perovskite oxides. Thus, the STO/Si system can be used as a growth substrate for fabrication of thin films of other functional oxides and carbon nanotube transistors.

The quite large lattice mismatch between STO and Si ($(a_{STO}-a_{Si})/a_{Si} \times 100\% = 28\%$) presents a challenge for epitaxial growth. Additionally, the formation of an amorphous oxide over Si surface may prevent STO film from crystal growth. Previous attempts to obtain high-quality STO thin films grown directly on Si have been unsuccessful, These STO films grown directly on Si using various deposition techniques were usually polycrystalline with randomly oriented grains. In the case of STO thin films by pulsed laser deposition (PLD), the co-existance of two peaks of (hh0) and (h00) was always observed.

It is known that randomly oriented polycrystalline films have certain limitations in various applications. Formation of various grain sizes and growth orientations and co-existence of secondary phase may cause low performance of the integrated devices. Consequently, it is commonly believed that the use of appropriate buffer layers between STO and Si substrate is required for the highly oriented growth, especially for the epitaxial growth of STO thin films. McKee et al. demonstrated the epitaxial growth of STO on Si (001) with a $SrSi_2$ submonolayer interface by molecular beam epitaxy (MBE) technique, Extensive research has been carried out on the growth of STO on Si (001) with various single buffer layers and/or multi-buffer layers. In this invention, we firstly develop a method to prepare STO films with single (110) orientation grown directly on differently oriented silicon substrates by PLD technique. Epitaxial STO (110) films have been grown successfully on Si (100) without any buffer layer.

SUMMARY OF THE INVENTION

This invention provides a method for preparing (110)-oriented perovskite oxide thin films grown directly on silicon and structures prepared with the process. More specifically the invention provides a method for growing $SrTiO_3$ films with single (110) out of plane orientation upon a silicon surface substrate, comprising: crystallizing an Sr-silicate interfacial layer epitaxially onto the silicon substrate under low oxygen pressure for about 1 to 5 minutes at a temperature of about 760 degrees C. to avoid oxidation of the silicon substrate; and depositing the $SrTiO_3$ film at low oxygen pressure at a temperature of about 760 degrees C.

The invention further provides a structure having a (100), (110); and (111) oriented Si substrate, and a (110)-oriented $SrTiO_3$ thin film thereon.

BRIEF DESCRIPTION OF THE DRAWINGS FIGURES

Figure 2:
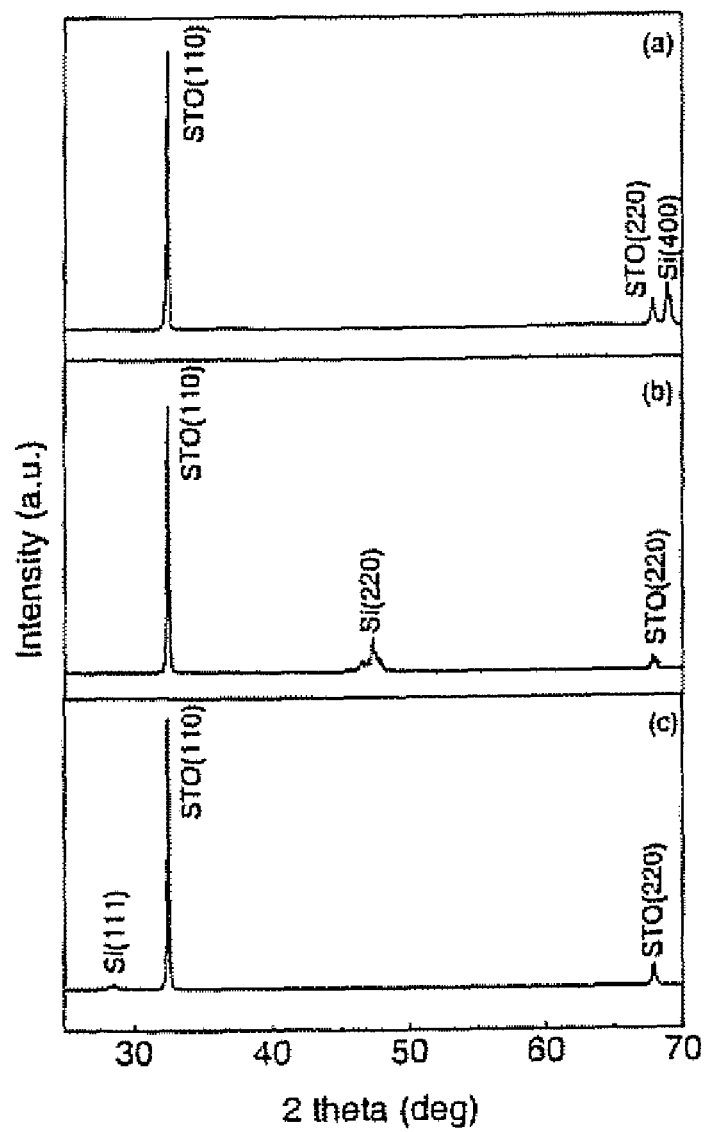
Figure 3:
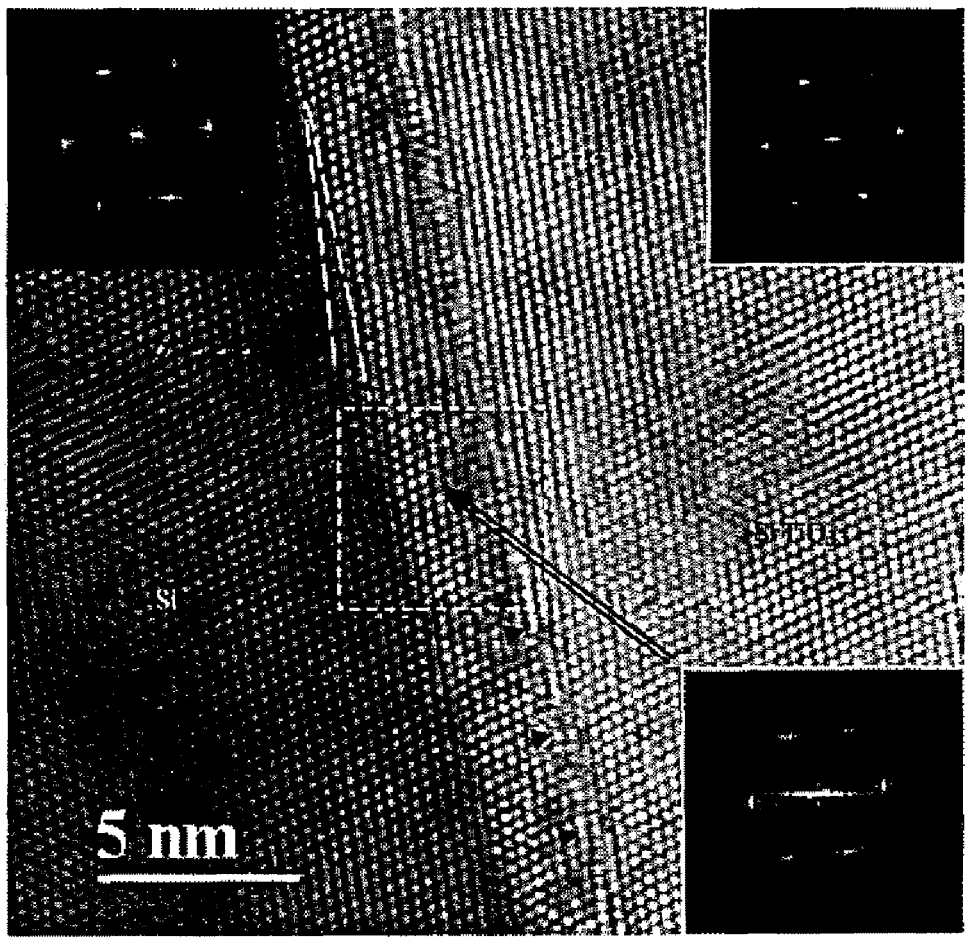
Figure 4:
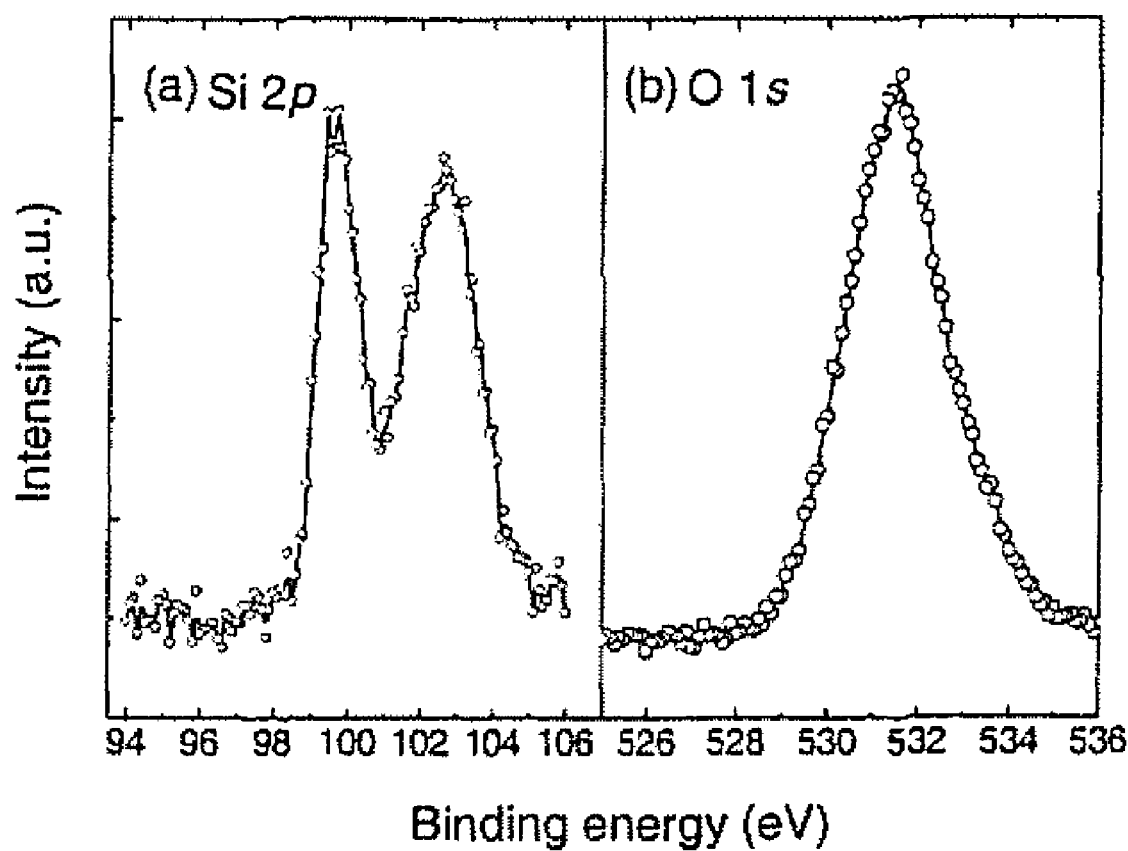
Figure 5:
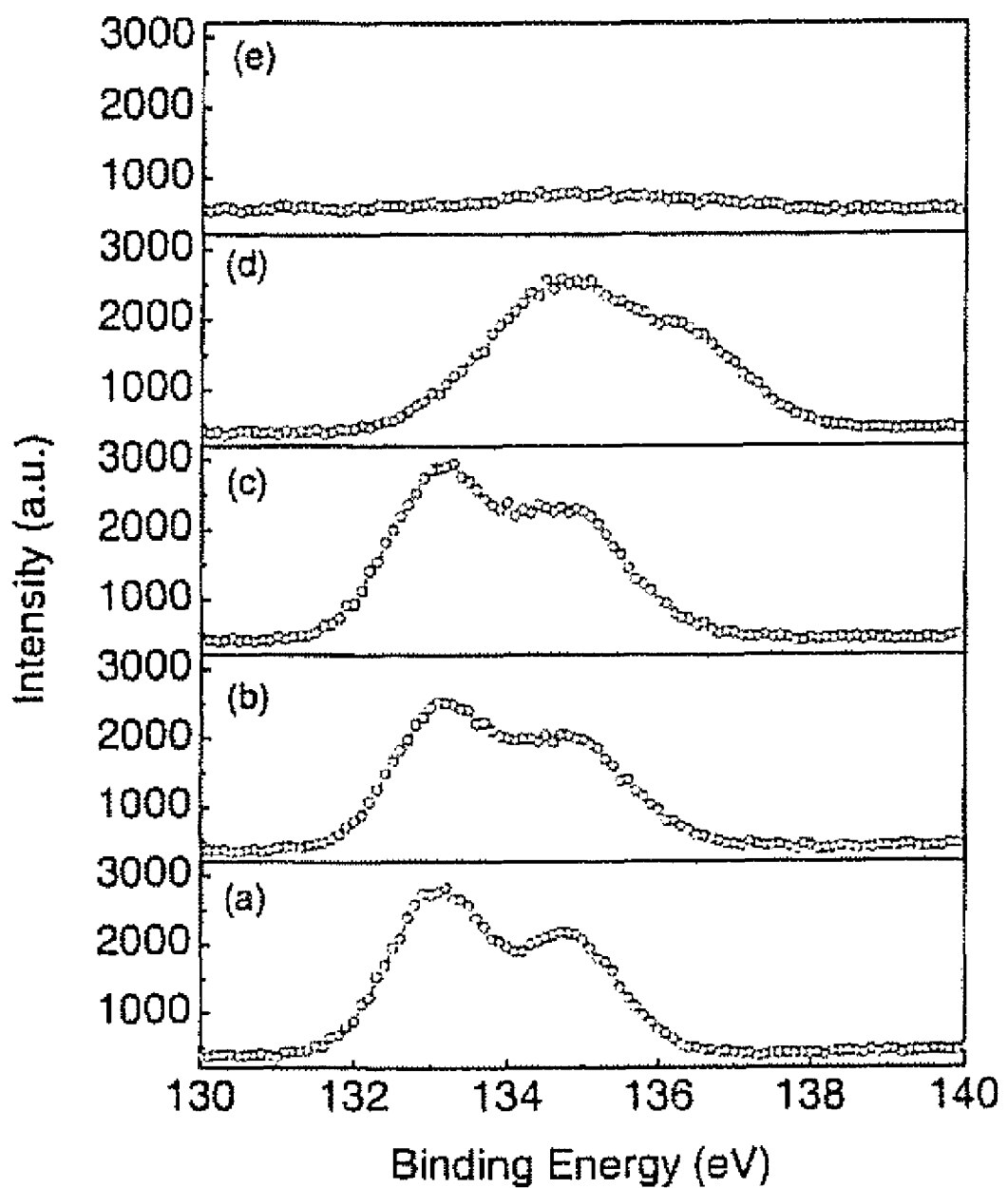

Further features and advantages of the invention may be understood with reference to the following specification taken in conjunction with the attached drawings in which:

FIG. 1 is a view of a silicon wafer upon which an epitaxial film of STO may be grown in accordance with the method of the present invention;

FIG. 2 includes X-ray diffraction (XRD) for STO films grown directly on different oriented substrates;

FIG. 3 includes the cross-sectional transmission electron microscopy (TEM) of the STO thin films grown on Si (100), and plots of corresponding fast Fourier transform taken at the STO film, STO/Si interface and Si substrate, respectively;

FIG. 4 shows X-ray photoelectron spectroscopy (XPS) spectra for (a) Si 2p and (b) O 1s core levels at the interface of STO and Si; and FIG. 5 shows XPS depth profile of Sr 3d core-level spectra for epitaxial STO (110) film on Si: (a) film surface, (b) after a 168 s sputtering, (c) after a 336 s sputtering, (d) after a 420 s sputtering, and (e) after a 487 s sputtering.

DETAILED DESCRIPTION OF THE PREFERRED EMBODIMENTS

The invention includes the process of depositing STO thin films on (100), (110) and (111)-oriented Si substrates. To remove the native oxide from the Si surface, the Si wafers were etched in a dilute HF solution prior to the loading into the chamber. Furthermore, the native oxide on the silicon substrate surface may be then completely removed by heating to 850° C. in $5 \times 10^{-6}$ mbar. With reference to FIG. 1, the substrates were mounted on a directly heated sample holder made of stainless steel sheet. During STO film growth in a two step process, the substrate temperature was maintained at 760° C. The initial growth of STO films was carried out under relatively low $O_2$ pressure of $1.4 \times 10^{-3}$ mbar for 1 min to avoid the rapid oxidation of the Si substrates. Subsequently, the STO films were deposited in an oxygen pressure of $1.4 \times 10^{-2}$ mbar for 2-40 min. The deposited film was cooled to room temperature in an oxygen atmosphere of 600 mbar.

FIG. 2 shows a typical XRD θ-2θ scan curve with log axis for intensity of STO thin films directly grown on (100), (110) and (111)-oriented Si substrates. The STO films were deposited at 760° C. The STO films exhibit (110) diffraction peaks in addition to the silicon substrate diffraction, with no significant extra XRD peaks from second orientation of the STO films. Furthermore, FIGS. 1(a), (b) and (c) clearly reveal that all samples present single (110) out-of-plane orientation, irrespective of the orientation of Si substrate. Furthermore, a low-angle Laue diffraction method was used to examine the in-plane epitaxial relationship and determine precisely the orientation in STO/Si. Analysis of the Laue diffraction pattern for STO/Si(100) reveals that the in-plane alignments are STO [001]//Si [001] and STO [1$\bar{1}$0]//Si [010]. It demonstrated that the epitaxial growth of STO thin films on Si without any buffer layer has been achieved through rotating the STO lattice by 45° with respect to the Si lattice. It is understandable that the 28% lattice constant mismatch between STO and Si can be reduced to a lattice mismatch of only 1.7% via such 45° rotation. In addition, the STO [001] direction was found to be roughly parallel to Si [001] and Si [$\overline{11}2$] for the STO/Si (110) and STO/Si(111) films, respectively. Also, the patterns for the STO/Si (110) and STO/Si (111) films showed arcs instead of spotty pattern. The arcs of diffraction patterns are due to the mosaic structure of the crystal.

FIG. 3 shows a cross-sectional TEM image of the STO thin films grown on Si (100), and plots of corresponding fast Fourier transforms (FFTs) taken at the STO film (inset in the upper right), the STO/Si interface (lower right) and the Si substrate (upper left), respectively. The incident electron beam is parallel to the [110] direction of the silicon substrate. The result confirms a highly epitaxial STO film grown directly on the Si substrate. An intermediate layer approximately 2.6 nm thick is visible, which grew epitaxially from the Si plane. Periodic array of misfit dislocations can be observed in the interface area as marked with arrow heads in the TEM image, revealing that lattice strain and inter-diffusion at the interface may occur. Also, it is notable that there is no blurred diffusing ring pattern in the FFTs of the intermediate layer, which is characteristic for amorphous structure in TEM analysis. The observation of a crystalline transition across the STO/Si has provided convincing evidence to exclude the formation of an amorphous interfacial layer, which is commonly found at the STO/Si interface grown by various techniques. From the TEM image of FIG. 3, it is visible that a considable miscut of around 8° was introduced in the Si substrate. It seems possible that the STO epitaxial orientation in this work has been influenced by the Si substrate miscut. Furthermore, the intermediate phase layer is very crucial to the subsequent epitaxy growth of the STO film. For certain Si(001) miscut angles and direction, the highly epitaxial film indicates that there may be a coincident site lattice at the interface between Si and the intermediate phase and/or the STO film that helps to stabilize STO in the epitaxial orientation reported here.

FIGS. 4 and 5 indicate XPS core levels of Si 2p and O 1s of the STO/Si interface. No peak corresponding to the binding energy of amorphous $SiO_2$ was found at the interface, which agrees well with the TEM observation shown in FIG. 3. As shown in FIG. 5, the Sr $3d_{5/2}$ and Sr $3d_{3/2}$ lines shift towards higher binding energy when the probing depth approaches to the STO/Si interface. It indicates that the chemical state of Sr has changed throughout the region of STO/Si interface. This finding excludes the possibility of the existence of a reduced $SiO_2$ compound. The peaks of Si 2p, O 1s and Sr 3d core-level spectra at the interface shown in FIG. 4 and FIG. 5 are in agreement with values in silicates. We could conclude that an interfacial Sr-silicate compound was formed at the STO/Si interface.

The (110)-oriented STO structure is useful for practical applications such as the preparation of ferroelectric-insulator-semiconductor devices. Also, (110)-oriented STO multilayer growth may provide a broad solution to the generic problem of polarity discontinuities at perovskite heterointerfaces. Earlier work indicated that the use of a single buffer layer like $Ce_{0.12}Zr_{0.88}O_2$ or double buffer layer like $CeO_2$/YSZ is necessary to prepare high-quality STO (110) films on Si (100) substrates. Our successful growth of epitaxial STO (110) films without any buffer layer is thus unusual. Moreover, direct epitaxy of STO on Si was commonly regarded as quite difficult due to the thermodynamic problem of interfaces. Therefore, the complicated and precise growth process for the epitaxy of STO thin films on Si has been presented in previous work, with great care exercised on the favorable interface stability, oxidation and strain considerations for each stage of the growth mainly by MBE. Comparatively, our process for the epitaxial growth is simpler and easier to handle because it does not require ultra-high-vacuum environment. In our experiments, the conditions for achieving epitaxial STO thin films on Si were limited to deposition conditions such as deposition temperature and oxygen pressure as well as specific growth sequences. It is likely that the silicate interfacial layer was formed initially at the early stage of film growth in our deposition, The interfacial layer could terminate the Si surface prior to the establishment of epitaxy of STO thin films. This reflects the fact that the Sr-silicate/Si interface may be more stable than the STO/Si interface.

The foregoing description illustrates several embodiments of the present invention. Various modifications will be apparent to those of ordinary skill in the art, all of which are intended to be within the scope of the invention as defined by the following claims.

We claim:

1. A method for growing $SrTiO_3$ films with single (110) out of plane orientation upon a silicon surface substrate, comprising: crystallizing an Sr-silicate interfacial layer epitaxially onto the silicon substrate under low oxygen pressure for about 1 to 5 minutes at a temperature of about 760 degrees C. to avoid oxidation of the silicon substrate; and depositing the $SrTiO_3$ film at low oxygen pressure at a temperature of about 760 degrees C.

2. A method according to claim 1, wherein the crystallizing step is carried out at an oxygen pressure of between about $1\times10^{-3}$ and $2\times10^{-3}$ for about 1 to 5 minutes.

3. A method according to claim 2, wherein the crystallizing step is carried out at an oxygen pressure of about $1\times10^{-3}$ and $1.5\times10^{-3}$ for 1 to 2 minutes.

4. A method according to claim 3, wherein the crystallizing step is carried out at an oxygen pressure of about $1.4\times10^{-3}$ for 1 to 2 minutes.

5. A method according to claim 4, wherein depositing the $SrTiO_3$ film is carried out in a low oxygen pressure of between about $1\times10^{-2}$ and $2\times10^{-2}$ for about 2 to about 45 minutes.

6. A method according to claim 4, wherein depositing the $SrTiO_3$ film is carried out in a low oxygen pressure of between about $1\times10^{-2}$ and $1.5\times10^{-2}$ for about 2 to 45 minutes.

7. A method according to claim 4, wherein depositing the $SrTiO_3$ film is carried out in a low oxygen pressure of between about $1.4\times10^{-2}$ for about 2 to about 40 minutes.

8. A method according to claim 7, additionally comprising the step of cooling the film to room temperature in an oxygen atmosphere of about 600 mbar.

* * * * *